United States Patent [19]
Batchelder

[11] Patent Number: 6,021,844
[45] Date of Patent: Feb. 8, 2000

[54] HEAT EXCHANGE APPARATUS

[76] Inventor: John Samuel Batchelder, 2 Campbell Dr., Somers, N.Y. 10589

[21] Appl. No.: 09/090,008

[22] Filed: Jun. 3, 1998

[51] Int. Cl.$^7$ ........................................................ F28F 7/00
[52] U.S. Cl. ................................... 165/80.3; 165/104.33; 165/80.4; 257/714; 317/234 R
[58] Field of Search .................. 165/80.3, 80.4, 165/80.5, 104.33; 257/714; 317/234 R

[56] References Cited

U.S. PATENT DOCUMENTS

| | | | |
|---|---|---|---|
| 3,654,528 | 4/1972 | Barkan | 165/104.33 |
| 4,519,447 | 5/1985 | Wiech | 165/104.33 |
| 4,619,316 | 10/1986 | Nakayama et al. | 165/104.33 |
| 4,745,966 | 5/1988 | Avery | 165/104.33 |
| 4,790,370 | 12/1988 | Niggemann | 165/104.33 |
| 5,001,548 | 3/1991 | Iversen | 165/80.3 |
| 5,316,007 | 5/1994 | Reichard | 165/104.28 |
| 5,335,143 | 8/1994 | Maling | 361/694 |
| 5,411,077 | 5/1995 | Tousignant | 165/104.33 |
| 5,731,954 | 3/1998 | Cheon | 361/699 |
| 5,763,951 | 6/1998 | Hamilton et al. | 257/714 |

FOREIGN PATENT DOCUMENTS 4225676  8/1992  Germany .

OTHER PUBLICATIONS

A.Bar–Cohen, "Low–Cost Thermal Management of High Power Electronic Components", Semi–Therm XIV, San Diego, CA, Mar. 8–9, 1998.

*Primary Examiner*—Ira S. Lazarus
*Assistant Examiner*—Terrell McKinnon

[57] ABSTRACT

An apparatus to transfer heat from a heat source to a heat absorber, the apparatus consisting of a thermally conductive rotor, a thermal transfer fluid, and a composite substrate with an internal cavity containing the thermally conductive rotor and the thermal transfer fluid. The surface of the composite substrate receives the heat source and the heat absorber. An external means impels the rotor to rotate within the internal cavity. Heat from the heat source is conducted through the surface of the composite substrate and through the thermal transfer fluid into the rotor. Heat is conducted from the rotating rotor through the thermal transfer fluid and through the surface of the composite substrate to the heat absorber. In the most preferred embodiment the thermal transfer fluid is a low melt metallic alloy, the rotor is a copper disk, and the rotor is motivated to rotate in the internal cavity of the composite substrate due to eddy currents generated by an external moving magnetic fields.

23 Claims, 14 Drawing Sheets

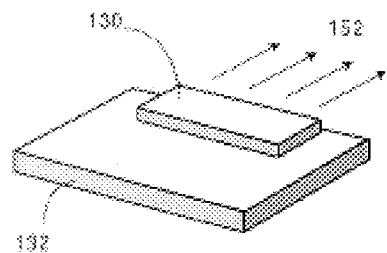
FIG.5a
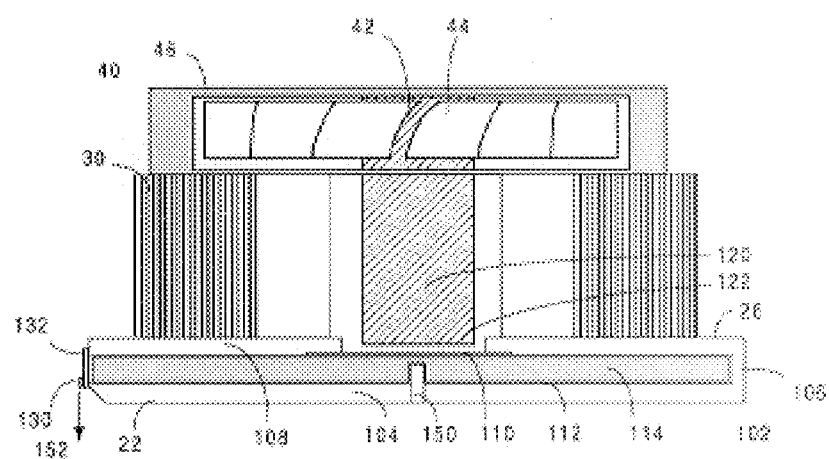
FIG.5b
FIG.5c

HEAT EXCHANGE APPARATUS

BACKGROUND OF THE INVENTION

In 1981 Carver Mead pointed out that a computer is a thermodynamic engine that sucks entropy out of data, turns that entropy into heat, and dumps the heat into the room. Today our ability to get that waste heat out of semiconductor circuits and into the room at a reasonable cost limits the density and clock speed of those circuits.

Cooling technologies are available that can transport very high densities of waste heat. For example the combined fluorocarbon and helium forced convection design described in U.S. Pat. No. 5,131,233 achieves a volumetric power transfer density which is much greater than what is expected for workstation microprocessors even through the year 2010. However, due to the complexity of this system, the cost to implement this system is orders of magnitude above the $5 per microprocessor targeted by Intel and the PC manufacturers.

A typical characteristic of heat transfer devices for electronics today is that the atmosphere is the final heat sink of choice. Air cooling gives manufactures access to the broadest market of applications. Another typical characteristic of heat transfer devices for electronics today is that the semiconductor chip thermally contacts a passive aluminum spreader plate, which conducts the heat from the chip to one of several types of fins; these fins convect heat to the atmosphere with natural or forced convection.

As the power to be dissipated by semiconductor devices increases with time, a problem arises: within about ten years the thermal conductivity of the available materials becomes too low to conduct the heat from the semiconductor device to the fins with an acceptably low temperature drop. The thermal power density emerging from the chip will be so high in ten years than even copper or silver spreader plates will not be adequate. A clear and desirable solution to this problem is develop inexpensive ways to manufacture more exotic spreader plate materials like pyrolitic graphite or diamond that have even higher thermal conductivities. If the cost of these exotic materials does not fall quickly enough, an alternative solution is needed, such as will be discussed shortly.

Heat can be transported by an intermediate loop of recirculating fluid; heat from the hot object is conducted into a heat transfer fluid, the fluid is pumped by some means to a different location, and there the heat is conducted out of the fluid into a fin means and finally into the atmosphere. Thermosiphons use a change in density of the heat transfer fluid to impel circulation of the fluid, while heat pipes and boiling immersion fluorocarbon systems use a phase transition of the heat transfer fluid to impel circulation of the fluid. While these approaches have important cooling applications, their cost for implementation will have to be reduced to generally impact semiconductor cooling. It is our suspicion that extracting the power for moving the heat transfer fluid from the heat flow itself is not energetically warranted in systems which dissipate hundreds of watts of waste heat from a semiconductor chip, and which dissipate several watts of electrical power by the fan circulating atmosphere through the fins.

Many heat transfer systems use an external source of energy to pump a recirculating heat transfer fluid. Most of these do not incorporate the pumped heat transfer fluid in an active spreader plate geometry that can be implemented as a replacement for a passive spreader plate. Most of these utilize the heat transfer fluid to transport the heat through most of the distance between the heat source and the heat absorber. Most of these incur the cost disadvantage of requiring separate motors to impel the heat transfer fluid and to impel the atmosphere. Most of these incur the reliability disadvantage of using sealed shaft feed-throughs to deliver mechanical power to the heat transfer liquid. Most of these incur the added assembly cost and reliability exposure associated with hoses and fittings. None of these existing heat transfer systems use a solid rotor and a thermal transfer fluid, both in an internal cavity of a monolithic assembly, to mechanically spread the heat from a relatively smaller source over a relatively larger area by transferring the majority of the heat from a heat source through the thermal transfer fluid into the solid rotor, and to transfer the majority of the heat back out of the solid rotor through the thermal transfer fluid to the heat absorber.

U.S. Pat. No. 4,519,447 describes an active spreader plate. The heat transfer fluid in the plate is impelled by magnetohydrodynamic pumping, which uses stationary magnetic fields plus large electric currents passing through the heat transfer fluid. The thermal properties of the plate are dominated by heat transported by the heat transfer fluid.

U.S. Pat. No. 5,316,077 describes an active spreader plate. The heat transfer fluid in the active spreader plate is impelled by an impeller embedded in the active spreader plate that is driven by a sealed shaft passing through the plate. The thermal properties of the plate are dominated by heat transported by the heat transfer fluid.

U.S. Pat. No. 5,335,143 describes an electronics cooling systems. A stack of rotating parallel disks is partially meshed with a finned heat sink or parallel circuit boards. The rotating disks motivate the motion of air through the finned heat sink. Heat from the finned heat sink is conducted to the air and the air is impelled out of the heat sink by the rotating disks.

U.S. Pat. No. 5,731,954 describes an electronics cooling system. The heat transfer fluid is impelled by an external pump, and the fluid circulates through discrete heat exchange elements through hoses and couplings. The thermal properties of the plate are dominated by heat transported by the heat transfer fluid.

SUMMARY OF THE INVENTION

The primary objective of this invention is to provide a low cost high reliability heat exchange apparatus that incorporates a composite substrate containing a moving solid thermal conductor and a heat transfer fluid, providing low thermal resistance cooling to high density heat sources.

A further objective of this invention is to provide a design for cooling electronic components that is compatible with the geometry and manufacturing tooling associated with the passive spreader plate heat sinks currently in general use.

A further objective of this invention is to provide an active spreader plate with no moving or rotary mechanical seals.

A further objective of this invention is to provide a heat sink design for electronic components that uses a single motor to impel atmospheric motion and the motion of an internal solid thermal conductor.

A further objective of this invention is to provide an active spreader plate without hoses or fluid couplings.

A further objective of this invention is to provide an isothermal surface while using a minimum of costly high thermal conductivity materials.

BRIEF DESCRIPTION OF THE DRAWINGS

FIG. 5a shows a laser bar array on a spreader plate.

FIG. 5b shows a cross section of a laser bar cooler implementation of the current invention.

FIG. 5c shows a plan view cross section of a laser bar cooler implementation of the current invention.

FIG. 10b shows the magnetic pole face configuration of the permanent magnet shown in FIG. 10a.

DETAILED DESCRIPTION

Figure 1:
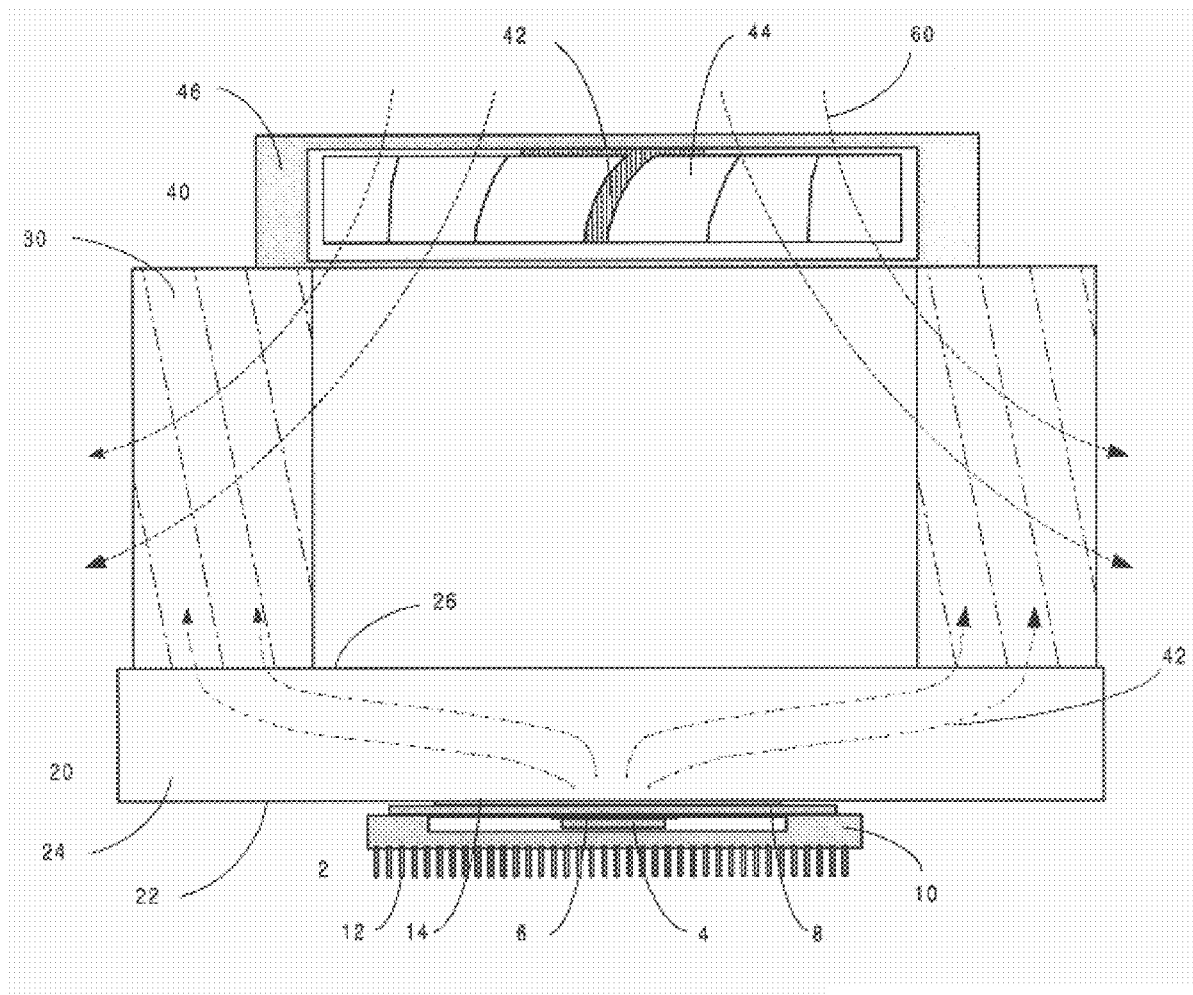
FIG. 1 shows an example from the prior art of a heat exchange device with a heat source, a spreader plate, a fin array, and an atmospheric mover.

The heat absorber used in this apparatus will typically facilitate transfer of heat to a surrounding fluid. For clarity, in the remainder of the specification we will refer to the surrounding fluid as atmosphere, however it can also be water, Freon, glycol, steam, or any other thermal transfer fluid. The heat absorber will typically therefore be a fin means to provide good thermal contact to the surrounding fluid. In a less preferred embodiment the heat absorber can contain a material undergoing a phase transition, so that the heat absorber by itself can be an isothermal sink for heat.

A thermal spreader plate, or spreader plate, is a device designed to conduct heat from a heat source with a relatively small heat emitting area to a heat absorber with a relatively larger heat absorbing area. An active spreader plate is a spreader plate that utilizes physical motion of components within the spreader.

A simplified limiting case helps to identify applications that need an active spreader plate instead of a passive spreader plate. Suppose that a heat source with an area $A_s$ needs to be attached to a heat sink with a thermal resistance $R_\theta$. We idealize the problem by allowing the heat source to be a hemisphere, and by allowing the spreader plate to be a large hemispherical shell. This idealized three dimensional radial heat flow minimizes the temperature drop within the spreader plate. If we say that the spreader plate can contribute at most a thermal resistance of $R_\theta/2$, we can solve for the minimum allowable thermal conductivity of the spreader plate material:

$$k_{spreader} = \frac{2}{R_\theta \sqrt{A_s}}$$

For example, the Intel road map for microprocessor cooling for the year 2006 calls for 200 watts to be dissipated at a junction temperature of 95° C. into ambient atmosphere at 45° C. from a 15 mm×15 mm chip. From these specifications we have that $R_\theta=0.25$° C./watt and that $A_s=2.25$ square centimeters. The minimum spreader plate thermal conductivity is then calculated by the above equation to be 533 watts/(° C. meter). Since pure aluminum has a thermal conductivity of 202 watts/(° C. meter), pure copper has a thermal conductivity of 385 watts/(° C. meter), and even silver (the metal with the highest thermal conductivity) is 410 watts/(° C. meter), no metals are available as passive thermal spreaders for this application, even under ideal conditions. For more realistic geometries, the minimum spreader plate thermal conductivity calculated is even higher.

We define a composite substrate to be a rigid assembly of at least two patterned objects that hermetically enclose one or more interior cavities. The most preferred embodiment of the composite substrate is an adhesively bonded assembly including at least one injection molded or forged aluminum shape. A preferred embodiment is for the composite substrate to be composed of several formed metal plates that are welded, brazed, or soldered together. A less preferred embodiment is for the composite substrate to be composed of several stamped plastic and metal plates that are bonded together with adhesives.

The most preferred application of a composite substrate for transferring heat from a heat generating object to a heat absorbing object is as an active thermal spreader plate for electronic heat sink applications. Other preferred applications include thermal processing heat exchangers, temperature control of isolated chambers, and thermal equalization of surfaces. For clarity and without a loss of generality, we will refer to the invention as an active spreader plate in the remainder of the specification.

To illustrate the intent and implementation of the invention, FIG. 1 shows and example of a prior art heat transfer device. The heat source (2) comprises a semiconductor chip (4) cemented or soldered (6) to a metal cover (8). The cover (8) is hermetically sealed to a chip carrier (10), which acts as a carrier for the electrical contacts (12) between the chip and the next level of electronic packaging. A compliant thermal conductor and electrical insulator (14) conducts heat from the heat source (2) to a passive spreader plate (20). Heat enters the passive spreader plate on its lower surface (22) and is conducted through the bulk of the passive spreader plate (24) to the periphery of the top surface (26), where it is conducted out of the passive spreader plate into heat absorbing devices (30). The passive spreader plate is typically aluminum owing to aluminum's good thermal conductivity, low cost, and low weight. Other materials used for the spreader plate are steel, copper, pyrolytic graphite composite, and diamond, in order of increasing performance and increasing cost. The heat flow lines (42) radiate from the heat source (2) through the passive spreader plate (20) to the heat absorber (30). The heat absorber (30) consists of a material permeable to fluid flow and capable of conducting heat away from the passive spreader plate (20); examples of various heat absorber designs will be subsequently described. A fan housing (40) supports a motor and rotor (42), and blades (44) are attached to the motor and rotor (42). Atmosphere is impelled to flow (60) through the fan and through the heat absorbing devices (30), so that heat is transferred to the air and exhausted into the environment. Other orientations of the atmosphere flow are operable, however this impinging flow is generally the most successful because by directing the flow towards the base of the heat absorber, the thermal efficiency of the heat absorber is typically increased.

Figure 2:
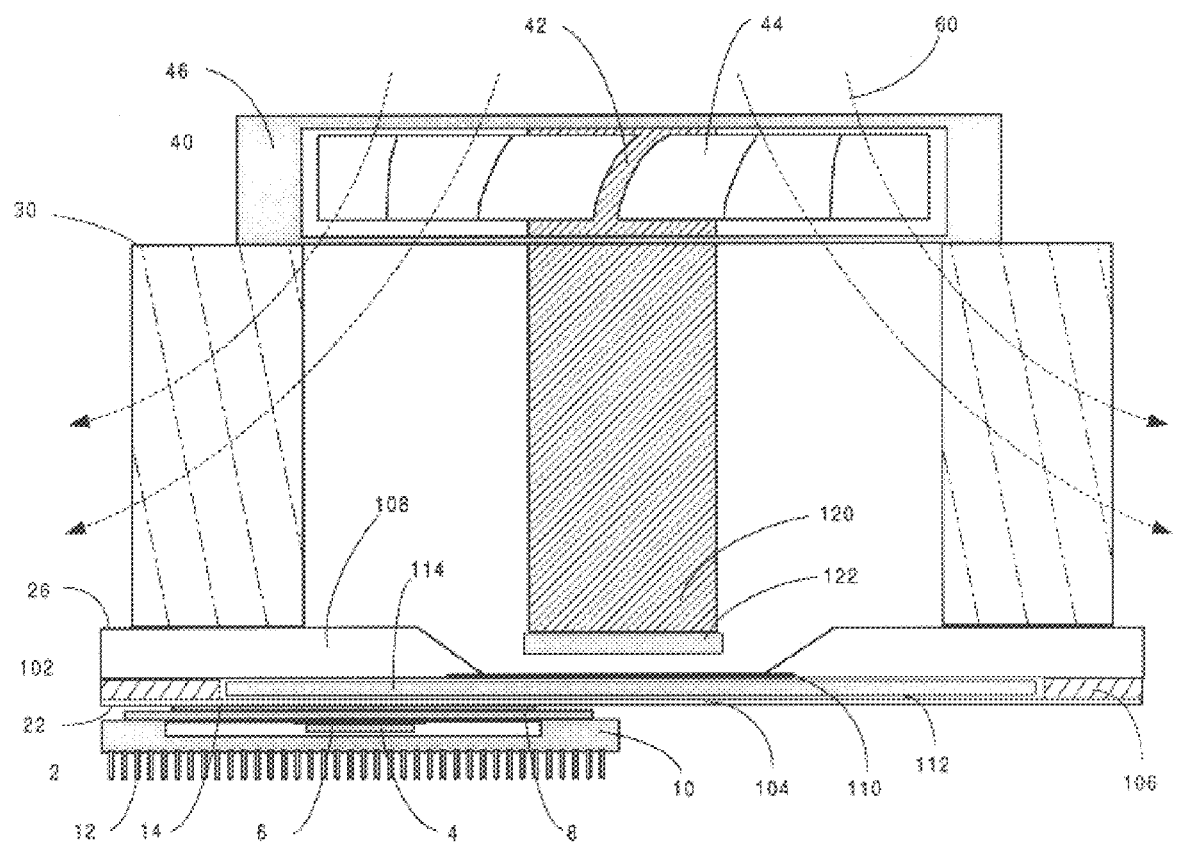
FIG. 2 shows a cross section of the current invention, including a composite substrate, an external impeller, an external motor, and a rotor internal to the composite substrate that is magnetically coupled to the external motor.

In FIG. 2 we show an embodiment of an active spreader plate as an evolution of the prior art design of FIG. 1. The heat source (2) comprises previously described elements. A compliant thermal conductor and electrical insulator (14) conducts heat from the heat source (2) to the active spreader plate (102). Heat enters the active spreader plate (102) on its lower surface (22), and is conducted through a metal plate (104) and through a thermal transfer fluid (112) into a thermally conductive rotor (114). The rotor (114) and the thermal transfer fluid are contained in an interior cavity of the active spreader plate formed by the metal plate (104), a pocket spacer (106), a passive spreader (108), and a magnetic window (110). The rotor (114) is impelled to rotate by a mechanism described later. The heat absorbed by a region of the rotor while it is close to the heat source (2) is released from that region of the rotor for the remainder of that rotation of the rotor; heat is transferred from the rotor (114) through the thermal transfer liquid (112) into stationary components of the active spreader plate (104, 106, 108, and 110). The heat is then conducted through the passive spreader (108) through the exterior surface of the active spreader (26) and into the heat absorber (30). As in FIG. 1, the heat absorber (30) is a fin means which is in intimate contact with an air stream (60) generated by a fan (40).

An extension tube (120) is rigidly attached to the fan rotor (42). A permanent magnet (122) attached to the end of the extension tube (120) rotates above the magnetic window (110) as the fan rotor (42) rotates. In a preferred embodiment the rotor (114) contains a permanent magnet that is attracted by the magnetic field from the permanent magnet (122) and causes the rotor (114) to turn synchronously with the fan rotor (42). In the most preferred embodiment, the rotor (114) contains a good electrical conductor such as copper, so that the moving magnetic field from the permanent magnet (122) induces an eddy current in the electrically conductive portion of the rotor (114), and the interaction between the eddy current and the field from the permanent magnet (122) causes the rotor (114) to turn at a rate slower than the rotation rate of the fan motor (42). The eddy current drive is preferable because there is no strong attractive force between the rotor (114) and the permanent magnet (122) that must be supported by thrust bearings on the rotor (114) and in the motor (42), as is the case with synchronous magnetic coupling. Eddy current drive is also preferable because the rotor (114) typically does not need to rotate at the same high speeds as the fan rotor (42), so that the difference between the rotation rates of the permanent magnet (122) and the rotor (114) which generates the eddy current is desirable. All of the magnetically coupled embodiments can have the advantage of hermetic sealing of the internal cavity without the cost and reliability risks associated with shaft feed throughs and rotating seals.

The magnetic window (110) can be any material for which the electromagnetic skin depth is large compared to the thickness of the window. The moving magnetic field is not attenuated by the window material if the material is non-magnetic and is not electrically conductive. In the most preferred embodiment the window is metallic, such as a thinned section of the metallic passive spreader (108). The skin depth for a good conductor is $c/\sqrt{2 \pi \mu \omega \sigma}$, where c is the speed of light, $\mu$ is the magnetic permeability of the conductor, $\omega$ is the angular frequency of the oscillating field, and $\sigma$ is the resistivity of the conductor. For a typical fan spinning at 50 revolutions per second and a permanent magnet with six pole faces around its circumference, $\omega$ is 942 radians per second. The skin depth for pure copper at that frequency is 0.21 inches, and the skin depth for pure aluminum at that frequency is 0.27 inches; for most other metals and alloys the skin depth with be smaller. If the magnetic window itself generates eddy currents, it will consume torque from the fan rotor (42).

A preferred embodiment of the invention uses a liquid metal for the thermal transfer fluid, such as mercury or gallium. In the most preferred embodiment the thermal transport fluid is a metallic alloy with a low melting temperature. Examples of low melt alloys include mixtures of sodium and potassium (liquid at 11° F.), mixtures of gallium, indium, and tin (liquid at 51° F.), and mixtures of bismuth, lead, indium, cadmium, and tin (liquid at 117° F.). The relatively high costs and low thermal conductivities of these alloys as compared with solid materials such as copper and aluminum suggest that the space inside the interior cavity and surrounding the rotor should be as small as practical; in the most preferred embodiment the spacing between the rotor and the cavity is between 0.001" and 0.020". Gallium alloys are corrosive to many metals. For example, if a copper rotor is to be used with a gallium alloy thermal transport fluid, the copper should be chrome or titanium plated. Sodium and potassium are advantageous due to their low cost and viscosity, however precautions are required such as minimizing the risk of contacting the metals with water. Less preferred embodiments of the thermal transfer fluid are composed of non-metallic alloy fluids like as water, hydraulic oil, or mineral oil.

An alloy which is liquid at the usual operating temperature of the active spreader plate may be initially solid. In a less preferred embodiment electric heaters can be added to the active spreader plate to pre-melt or accelerate the melting of the alloy so that the rotor is free to rotate. In the most preferred embodiment the thermal conductivity of the cold rotor is sufficient to initially both cool the heat source and to melt the alloy in the internal cavity of the active spreader plate. The rotor (114) should be at least large enough in diameter that it thermally contacts the heat source (2). Generally extending the rotor (114) to be as large in diameter as is readily contained in the footprint of the pocket spacer (106) allows the passive spreader (108) to be thin while still providing a low spreading resistance between the rotor and the heat absorber (30). Generally the required rotation rate of the rotor is inversely proportional to the thickness of the rotor; a 0.1" thick copper rotor spinning at 3 revolutions per second or higher will appear to have a uniform temperature for most applications.

The average rotational velocity of the thermal transfer fluid at a given radius will be half that of the rotor. Since the thermal transfer fluid is moving, it will transport heat from the heat source to the heat absorber. In the less preferred embodiment of a relatively thinner rotor surrounded by a relatively thicker thermal transfer fluid layer, heat transfer due to the motion of the thermal fluid will be greater than heat transfer which passes heat through the rotor. In the more preferred embodiment of a relatively thicker rotor surrounded by a relatively thinner thermal transfer fluid layer, heat transfer due to the motion of the thermal fluid will be less than heat transfer which passes heat through the rotor.

In the most preferred embodiment there is a pocket of atmosphere or inert gas trapped in the internal cavity with the rotor and the thermal transfer fluid. While the rotor is spinning there will be a centripetal force sending the alloy to the periphery of the disk and bringing gas to the center of the disk, so that the presence of the gas does not reduce the thermal performance of the active spreader plate. The presence of the gas reduces the amount of alloy used, and it provides a buffer volume to compensate for differences in thermal expansion coefficient between the rotor, the alloy, and the active spreader plate.

In FIG. 2 a tubaxial fan impels the atmosphere to flow in contact with the fin means. Other types of impellers known to those skilled in the art can also be used, such as blowers and laminar flow fans.

The components of the active spreader plate shown in FIG. 2 are designed to be stamped from sheets and subsequently assembled with adhesives, ultrasonic bonding, solvent bonding, brazing, or welding. Those skilled in the art will recognize that the individual components of the active spreader plate could be molded, and that several of the described components can be functionally combined if the components are molded.

Figure 3:
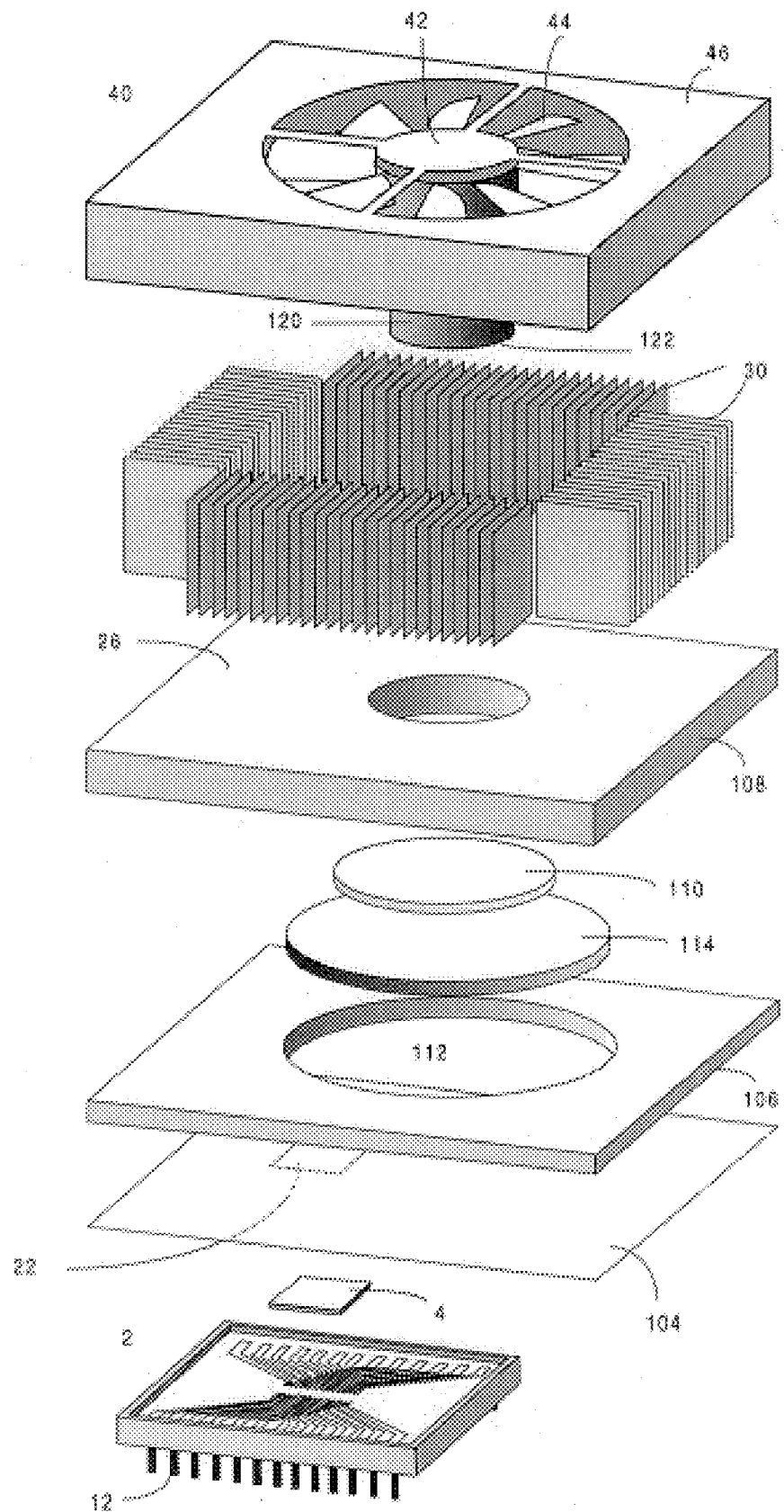
FIG. 3 shows an exploded assembly drawing of the cross section shown in FIG. 2.

FIG. 3 shows an exploded perspective view of the active thermal spreader shown in FIG. 2.

Figure 4:
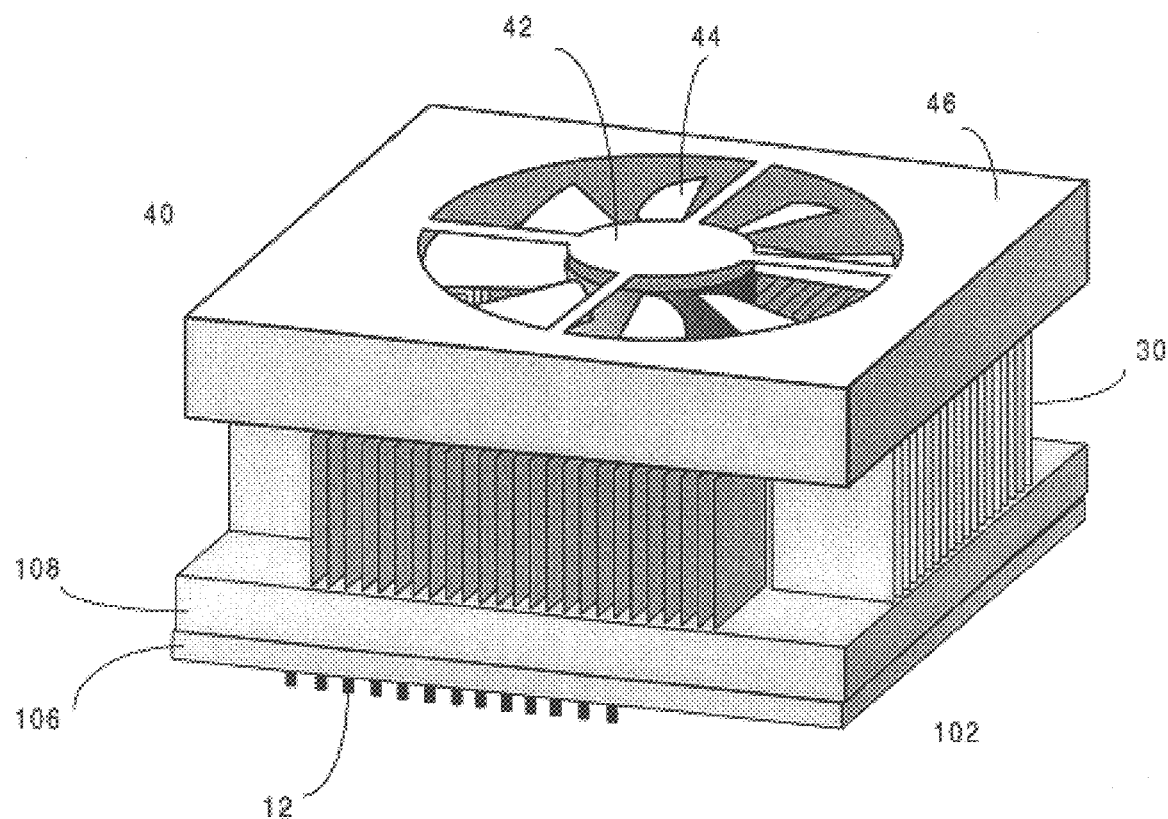
FIG. 4 shows an assembly of the design shown in FIG. 2.
Figure 6A:
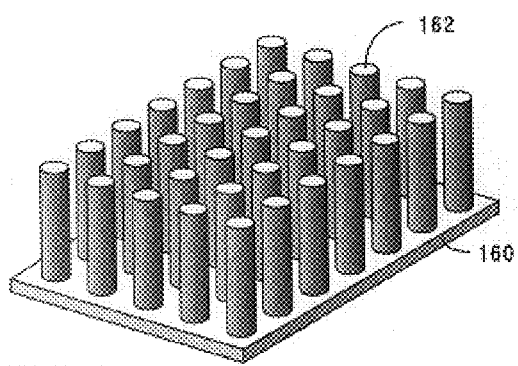
FIG. 6a–FIG. 6f show a variety of prior art geometries of fin means.
Figure 6D:
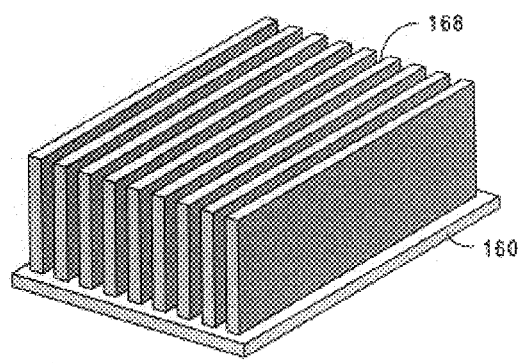
Figure 6B:
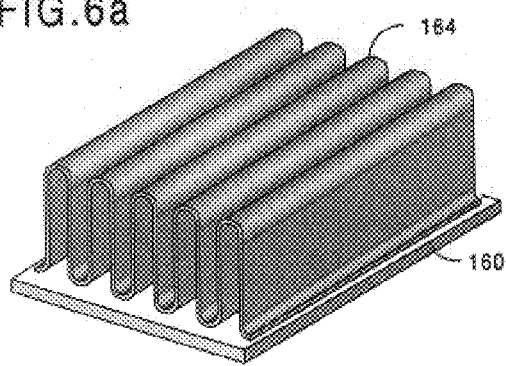
Figure 6E:
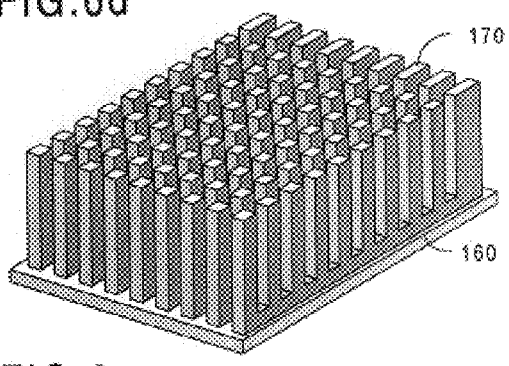
Figure 6C:
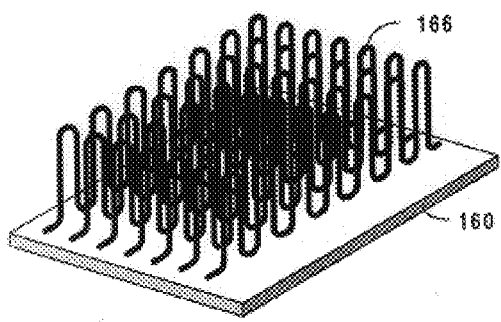
Figure 6F:
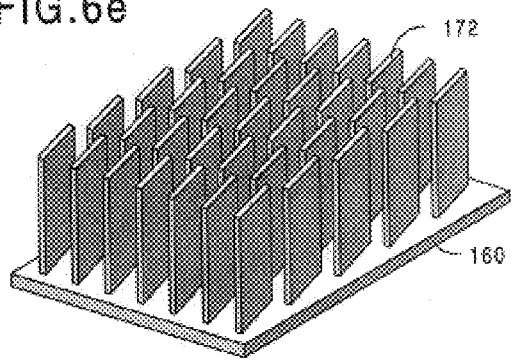

FIG. 4 shows an assembly perspective view of the active thermal spreader shown in FIG. 2.

FIG. 5a shows a solid state laser bar array (130) soldered to a diamond spreader plate (132). Light (152) is emitted nearly in the plane of the spreader plate (132). An example of requirements for cooling a laser bar is an array 0.6 mm×10 mm with a junction temperature of 55° C. releasing 40 watts of heat into 35° C. air. Arrays like this are typically cooled today with the laser bar array (130) and spreader (132) attached to a copper fin array in intimate contact with flowing pressurized refrigerated water.

FIG. 5b shows the solid state laser bar array (130) and spreader plate (132) attached to a preferred embodiment of the active spreader plate. By conducting heat from the laser bar array (130) through the spreader plate (132) and through the thermal transfer fluid (112) into the perimeter of the rotor (114), the laser bar (130) and its light emission (152) can be physically remote from the fan (40), fins (30), and active spreader plate (102). The embodiment in FIG. 5b differs from that shown in FIG. 2 in that the rotor (114) in FIG. 5b rotates on a sleeve bearing about a pin (150).

FIG. 5c shows a plan cross section of the embodiment shown in FIG. 5b.

In a less preferred embodiment there is no bearing centering the rotor in the internal cavity of the active spreader plate. This embodiment is functional particularly when the density of the thermal transfer fluid and the density of the rotor are closely matched. The rotation of the rotor generates viscous shear in the thermal transfer fluid between the perimeter of the rotor and the inner surface of the internal cavity, creating some lubrication between the rotor and the inner surface of the internal cavity. In a more preferred embodiment, such as shown in FIG. 5b, a bearing centrally locates the rotor in the internal cavity of the active spreader plate. If the rotor is less dense than the thermal transfer fluid, centripetal acceleration of the fluid will tend to center the rotor on axis as the rotor turns; for this case a central bearing serves to counteract buoyancy of the rotor in the fluid.

FIGS. 6a–6f shows several prior art embodiments of fin means. Each of the fin means is characterized by a thermal conduction means such as pins (162), folded fins (164), wires(166), bonded fins (168), pin fins (170), and louvers (172). Other fin means include stampings, castings, plates, or sheets. The thermal conduction means are arrayed so as to be permeable to a flowing heat transfer fluid such as the atmosphere, while also thermally contacting one or more surfaces (160). The fin means function to increase the effective area of contact between a heat transfer fluid such as the atmosphere and one or more surfaces (160). Fin means can be manufactured by forging, folding, gluing, welding, brazing, casting, molding, coining, or other processes. Fin means are preferably composed of aluminum, and can also be formed using metals such as copper, aluminum, iron, zinc, nickel, and silver, as well as composite materials including graphite filled plastics. The surfaces of the thermal conduction means can be grooved, textured, dimpled, embossed, or drilled to increase their surface area in contact with the heat transfer fluid.

Figure 7:
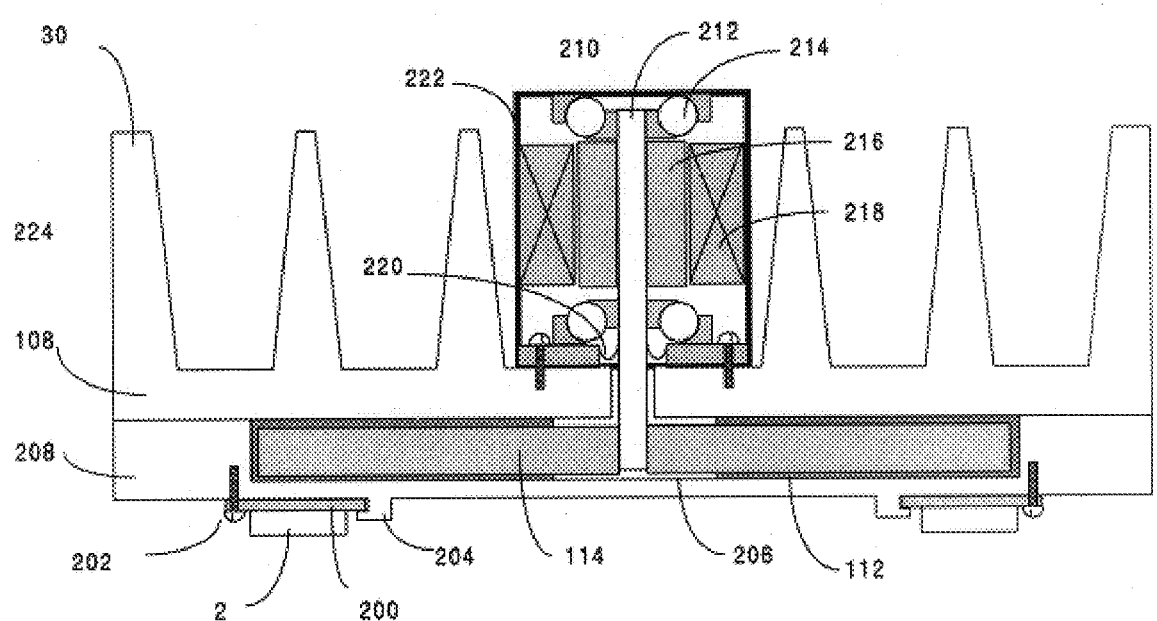
FIG. 7 shows an implementation of the current invention with passive heat absorber fins and a rotor driven by an axle from an external motor.

FIG. 7 shows a cross section of a passive heat sink containing an active spreader plate. Two heat sources (2) are each attached to mounting plates (200), and the mounting plates (200) are clipped (204) and screwed (202) to the outside of a casting (208) which combines the functions of a metal plate (104) and a pocket spacer (106). A second casting (224) combines the functions of the passive spreader plate (108) and the fins (30). A motor (210) with an axle (212), bearings (214), armature (218), coils (216), gland seal (220), and case (222) is attached to the casting (224) so that the axle penetrates the casting (224) and becomes the axle for the rotor (114). An air pocket (206) in the internal cavity allows for thermal expansion variations of the rotor, the thermal transfer fluid, and the castings (208 and 224). The exterior surface (26) of the active spreader in this case passes through the bases of the fins (30).

In the most preferred embodiment of the active spreader the interior cavity is hermetically sealed, so that air does not leak into or out of the interior cavity. This is useful to prevent the low temperature alloys from oxidizing, to prevent the alloys from leaking, and to prevent other forms of deterioration. If an axle penetrates the composite substrate to connect the rotor with an external motor, various sealing mechanisms can be used against the rotating shaft. Ferrofluidic seals can be hermetic, whereas most gland seals have a small non-zero leakage rate.

The embodiment shown in FIG. 7 is preferred for passive spreader plate applications with large areas requiring high reliability. For most of the life of the spreader plate the rotor can reduce the junction temperature of the power devices attached to it, increasing their expected life. In the event that the rotor drive fails for any reason, the remaining thermal transfer fluid and rotor in the internal cavity of the active spreader gives it approximately the same thermal performance as a solid passive thermal spreader of the same dimensions. This embodiment gives an example of cooling several components with a single rotor.

Figure 8:
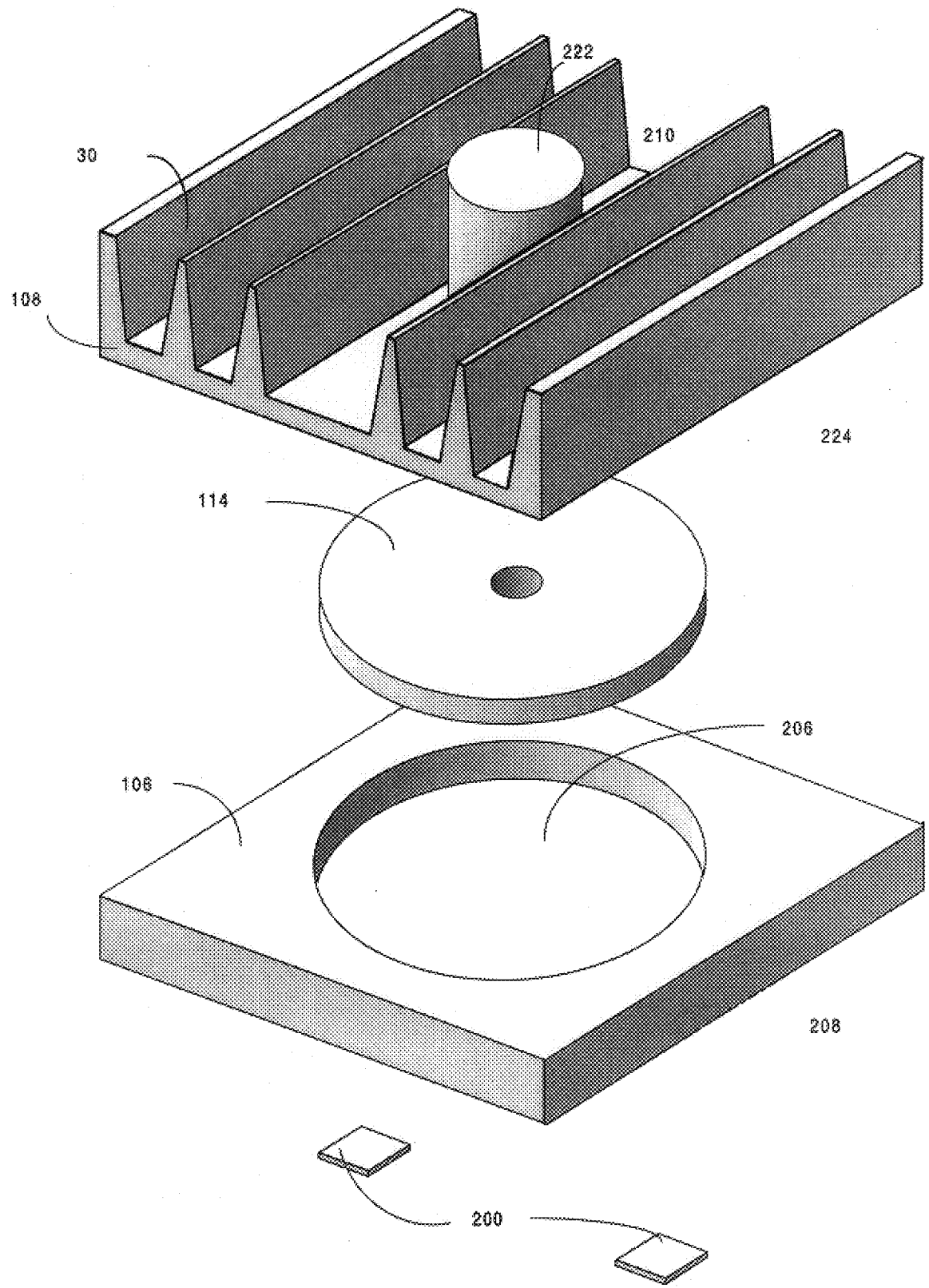
FIG. 8 shows an exploded assembly drawing of the cross section shown in FIG. 7.

FIG. 8 shows an exploded perspective view of the active thermal spreader shown in FIG. 7.

Figure 9:
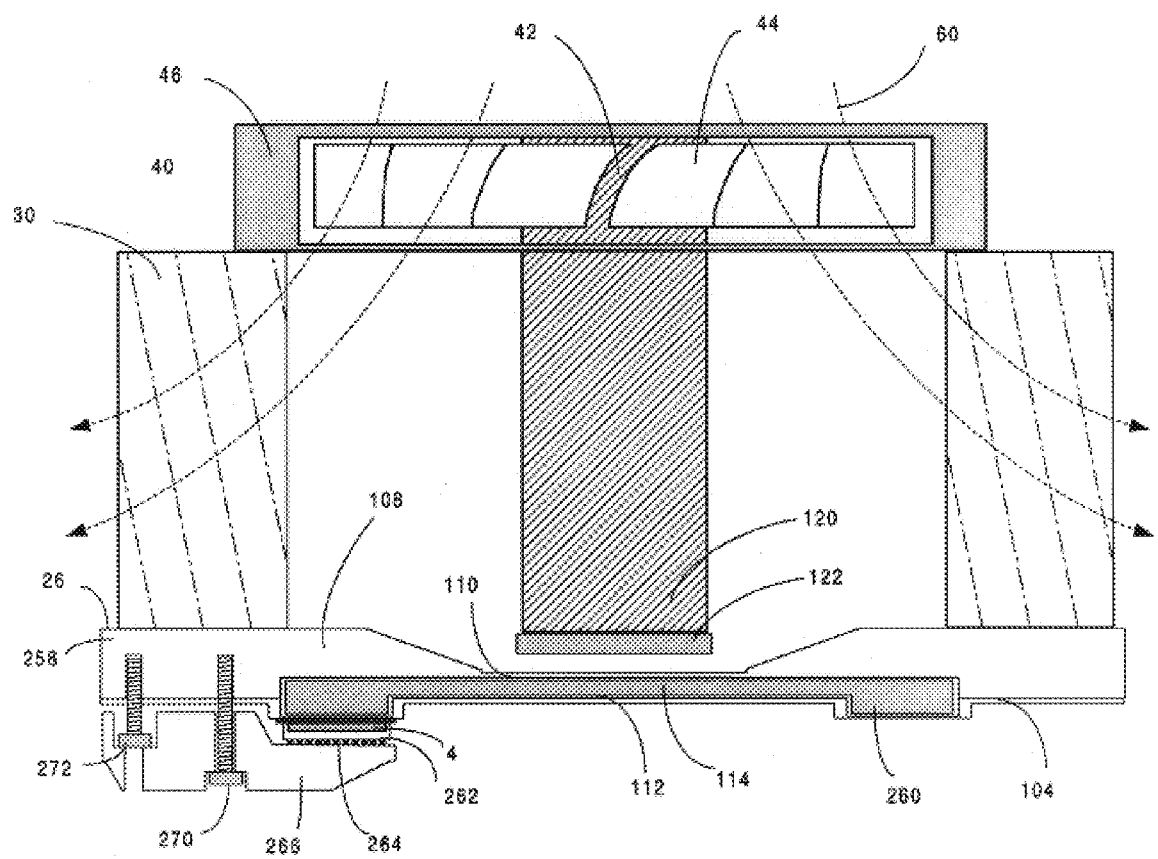
FIG. 9 shows an implementation of the current invention in which the rotor is axially symmetric and the heat source is clamped to the external surface of the composite substrate.

FIG. 9 shows a more preferred embodiment of an active thermal spreader. It differs from the design shown in FIG. 2 in that pocket spacer (106), the passive spreader (108), and the magnetic window (110) are combined in a single casting (258). The rotor (114) is no longer a simple disk, but has a raised rim (260) that allows the heat producing component (4) to be spaced further from the bulk of the active spreader plate. The metal plate (104) is formed to conform to the rotor (114) and to seal with the casting (258). Pressure on the thermal joint between the heat producing component (4) and the metal plate (104) is applied through the ball grid array (264) and the electrical redistribution package (262) with a support bracket (266) and two adjustment screws (270 and 272).

One advantage of the more complex rotor geometries is that the metal plate (104) can be made stiffer adjacent to the area contacted by the heat source (4). The thickness of the metal plate (104) can contribute a substantial fraction of the overall thermal resistance of the heat sink assembly shown in FIG. 9. Another advantage of the more complex rotor design is that the bulk of the active thermal spreader can be made to mechanically clear the circuitry to which the heat source (4) is attached.

FIG. 10 shows the preferred configuration for generating the moving magnetic field external to the active spreader plate. A fan housing (46) supports a rotor (42), onto which are attached fan blades (44) and a rotor extension (120). A ring ceramic permanent magnet (122) is attached to the end of the rotor extension (120). The ring ceramic magnetic (122) could alternatively be replaced with a series of smaller magnets. Ceramic magnets are the preferred embodiment because of their low cost; if Alnico or rare earth magnets become more cost effective they would be preferable to ceramic magnets.

Figure 10A:
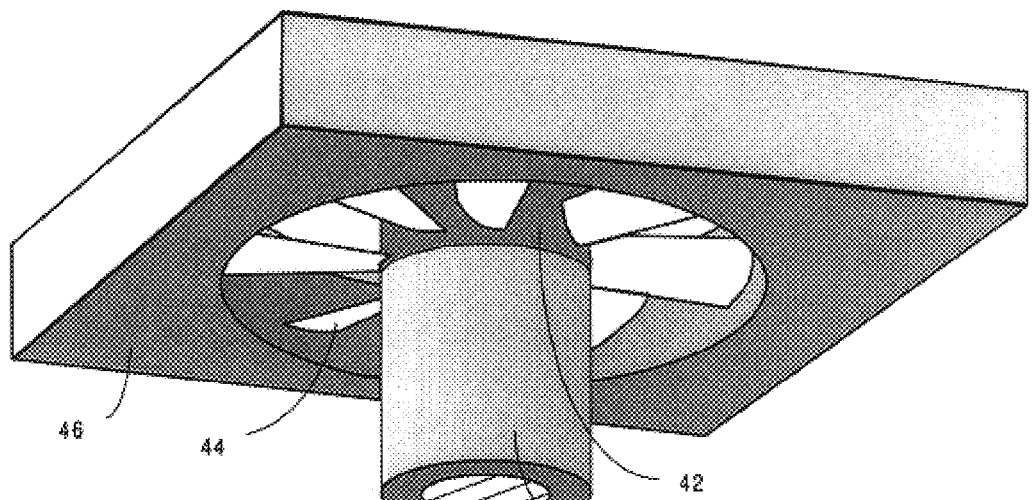
FIG. 10a shows a detail of the fan from FIG. 2 with an attached permanent magnet.
Figure 10B:
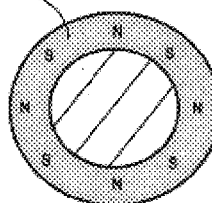

FIG. 10b be shows the preferable magnetic poling geometry of the ring ceramic magnet (122). The magnet is preferably poled to create a series of alternating north and south pole faces around the circumference of the ring. When a permanent magnet poled as in (122) is rotated above a washer of electrically conductive material (304), eddy currents are induced as shown (302). The magnetic fields generated by the eddy currents (302) create a torque on the washer (304) in the direction of rotation of the permanent magnet (122).

Figure 10C:
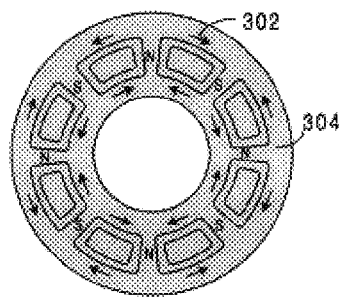
FIG. 10c depicts the electrical eddy currents generated in an electrically conductive washer in the presence of moving magnetic fields generated by rotating the magnet shown in FIG. 10b.
Figure 10D:
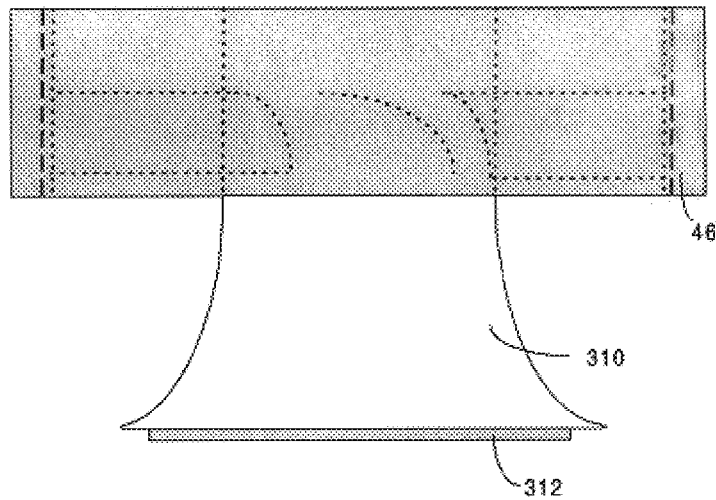
FIG. 10d shows an alternative flared fan extension and permanent magnet.

In FIG. 10c we show an alternative preferred embodiment in which the rotor extension (310) flares out as it approaches the end to which the permanent magnet (312) is attached. The flared configuration is advantageous since more torque is imparted to a magnetically coupled rotor for the same magnetic field strength, and since air from the fan is smoothly deflected from its axial direction through the fan to the radial motion through the fin means.

If the heat transfer fluid is a good electrical conductor, the moving magnetic fields can generate eddy currents in the heat transfer fluid directly. If this is done, the drag on the fluid by the moving external magnetic field imparts vorticity to the flow so that the fluid becomes its own centripetal pump. This is not a preferred embodiment for the following reasons: solid metals such as aluminum and copper have more than four times the thermal conductivity of the available low temperature alloys; solid metals such as aluminum and copper are less expensive than most of the low temperature alloys; solid metals such as aluminum and copper are less environmentally hazardous than most of the low temperature alloys; the flow velocities required to generate the same heat transfer rates is much greater for the alloys alone than is the rotational velocity of the rotor with the alloy; and the eddy current coupling to most of the low temperature alloys is much weaker than it is to solid metals such as aluminum and copper.

Figure 11A:
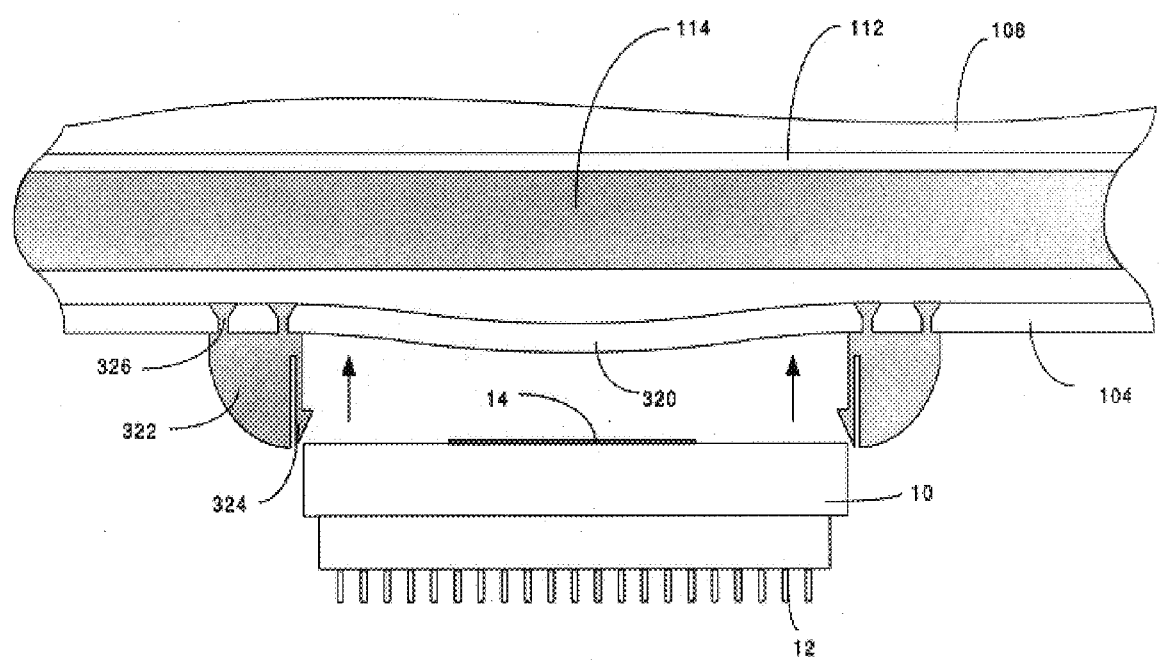
FIG. 11a details a clip mount for attaching a heat source to the exterior surface of the composite substrate.

FIG. 11a shows a detailed cross section of a preferred embodiment of an attachment mechanism between a heat source and an active spreader plate. The heat source is shown separate from the active spreader plate. The chip carrier (10) supports the electrical contacts (12) and the compliant interface (14). The metal plate (104) is preformed (320) where it will contact the compliant interface to make a uniform pressure on the compliant interface (14) when the chip carrier (10) is assembled with the active spreader plate. Clips (322) are riveted (326) or otherwise attached to the metal plate (104). The clips (322) carry flexure hooks (324) that mate with the chip carrier (10).

Figure 11B:
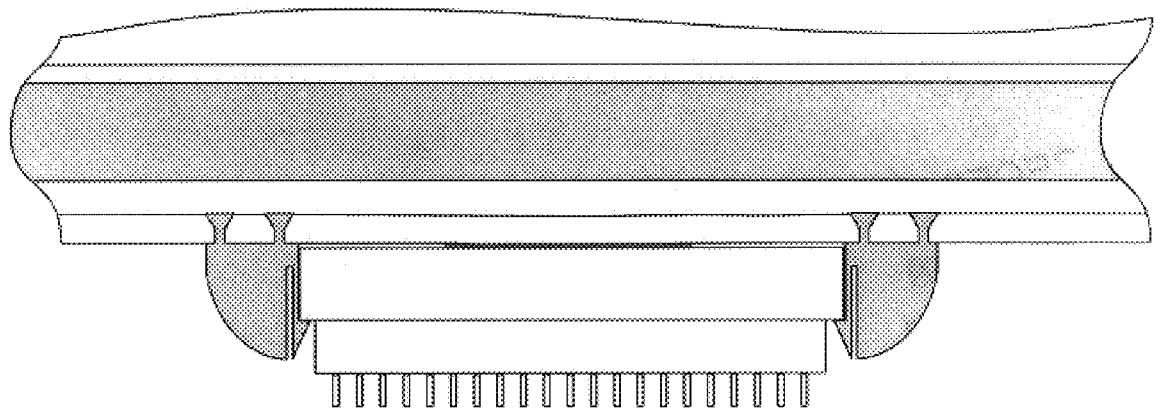
FIG. 11b shows the configuration of FIG. 11a where the heat source has been assembled with the composite substrate.

FIG. 11b shows an assembly of the design shown in FIG. 11a.

Figure 12:
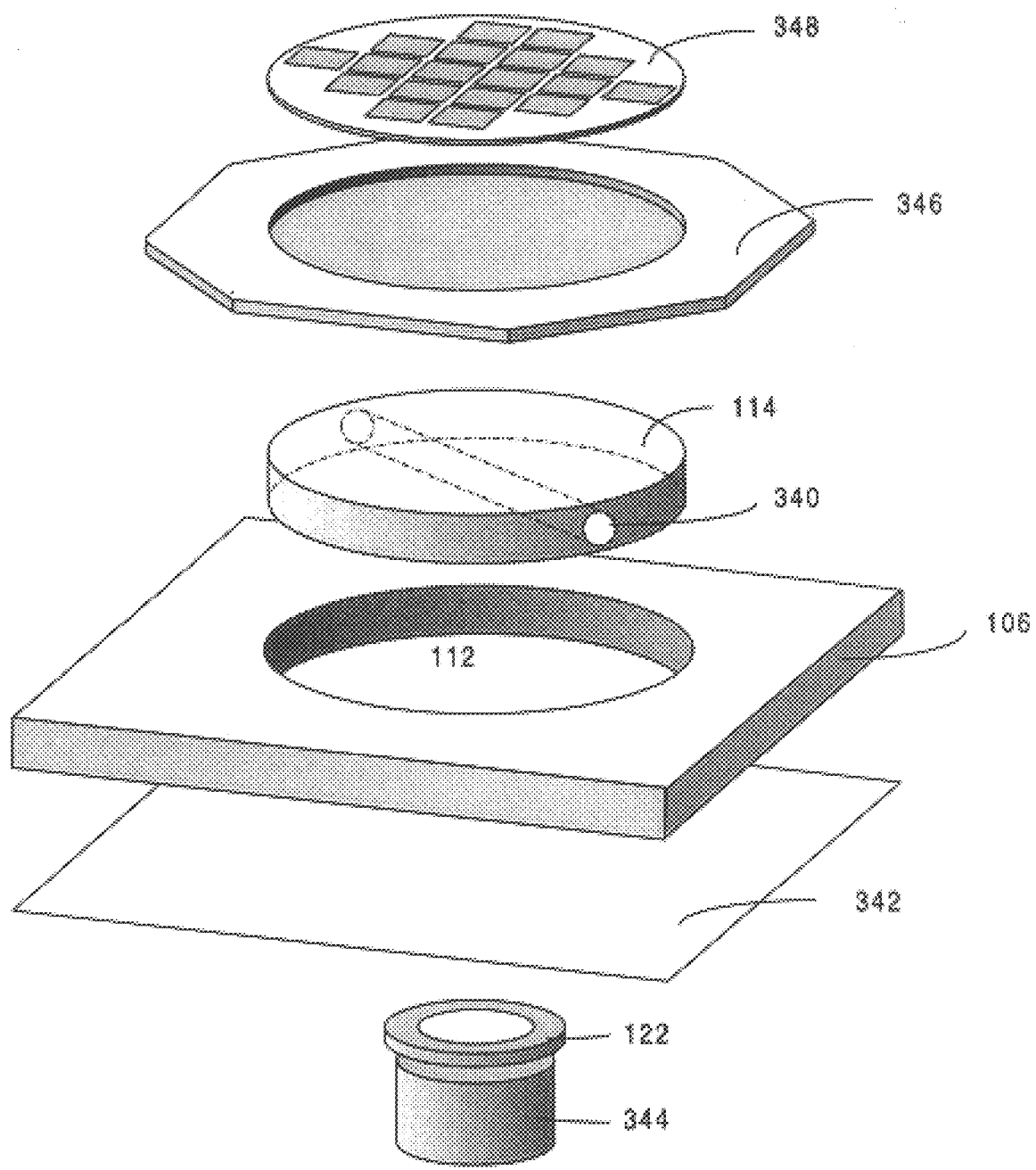
FIG. 12 shows the current invention configured to equalize the temperature of a silicon wafer during manufacturing.

FIG. 12 shows an active spreader plate configured to keep a silicon wafer at a uniform temperature during manufacturing. The wafer (348) is held by a thermally conductive chuck (346). The chuck (346), the pocket spacer (106), and the backing plate (342) together bound an interior cavity (112) that contains a thermally conductive rotor (114) and a thermal transport fluid. The rotor (114) contains one or more inserts (340) of high thermal conductivity material, such as pyrolitic graphite. A permanent magnet (122) below the backing plate (342) is rotated by a motor (344). The rotary motion of the rotor (114) causes the temperature of the wafer (348) at a constant radius to be uniform, and the thermal conductivity of the rotor (114) and particularly of the insert (340) causes the temperature of the wafer (348) at different radii to be uniform.

Figure 13:
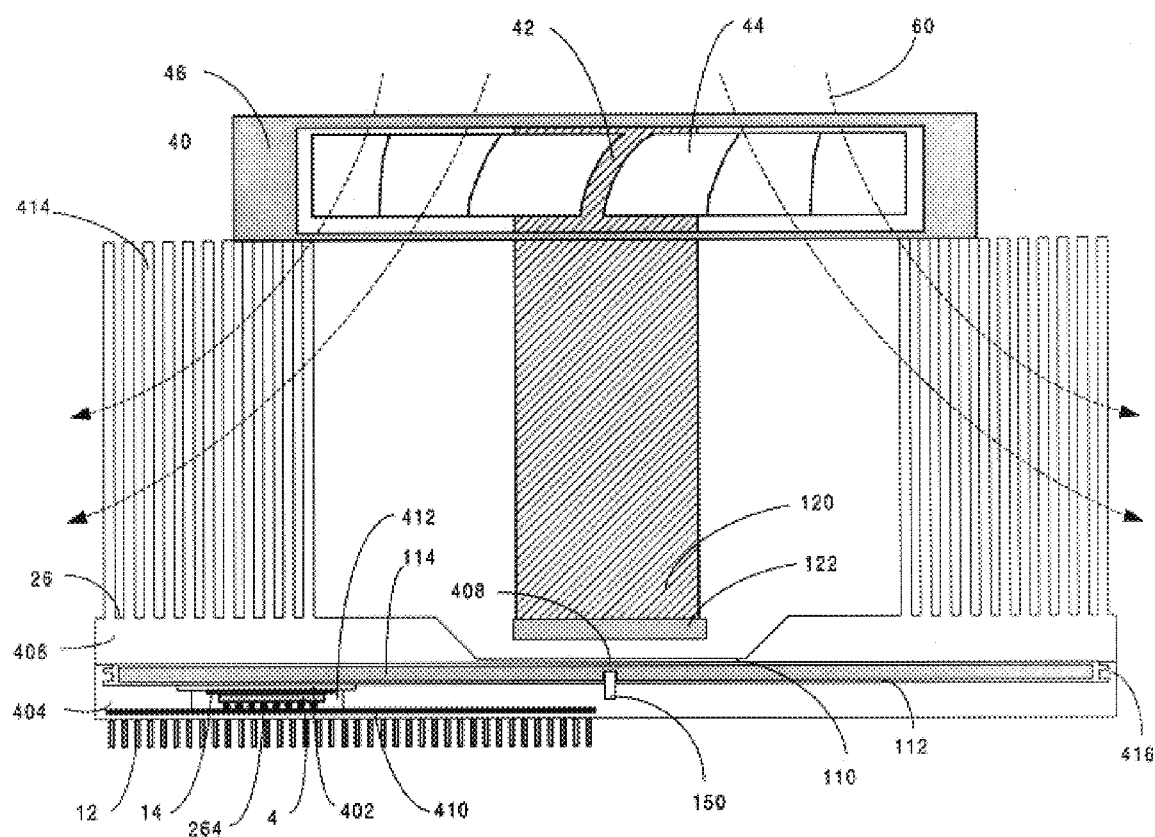
FIG. 13 shows the current invention configured with the heat source inside of the composite substrate.

FIG. 13 shows an active spreader configured with the heat source (4) inside of the active spreader. Heat from the semiconductor chip (4) passes through a conformal coating (14) and an interface plate (402) into an interior cavity (112) of the active spreader. A thermal transfer fluid conducts heat to the thermally conductive rotor (114). Heat from the rotor (114) is conducted through the thermal transfer fluid to the upper casting (406) and into the pin fin array (414). The magnetic window (110) and pin fin array (414) are an integral part of the upper casting (406). A chip carrier (404) forms the lower and perimeter surfaces of the interior cavity (112). The chip is electrically connected through a ball grid array (264) to a redistribution layer (410), and the redistribution layer (410) is connected to a pin array (12). A flexure joint (416) allows the chip carrier (404) and the upper casting (406) to thermally expand at different rates. The rotor (114) is mounted on a central bearing pin (150) and is constrained by a boss (408) on the upper casting (406).

Figure 14:
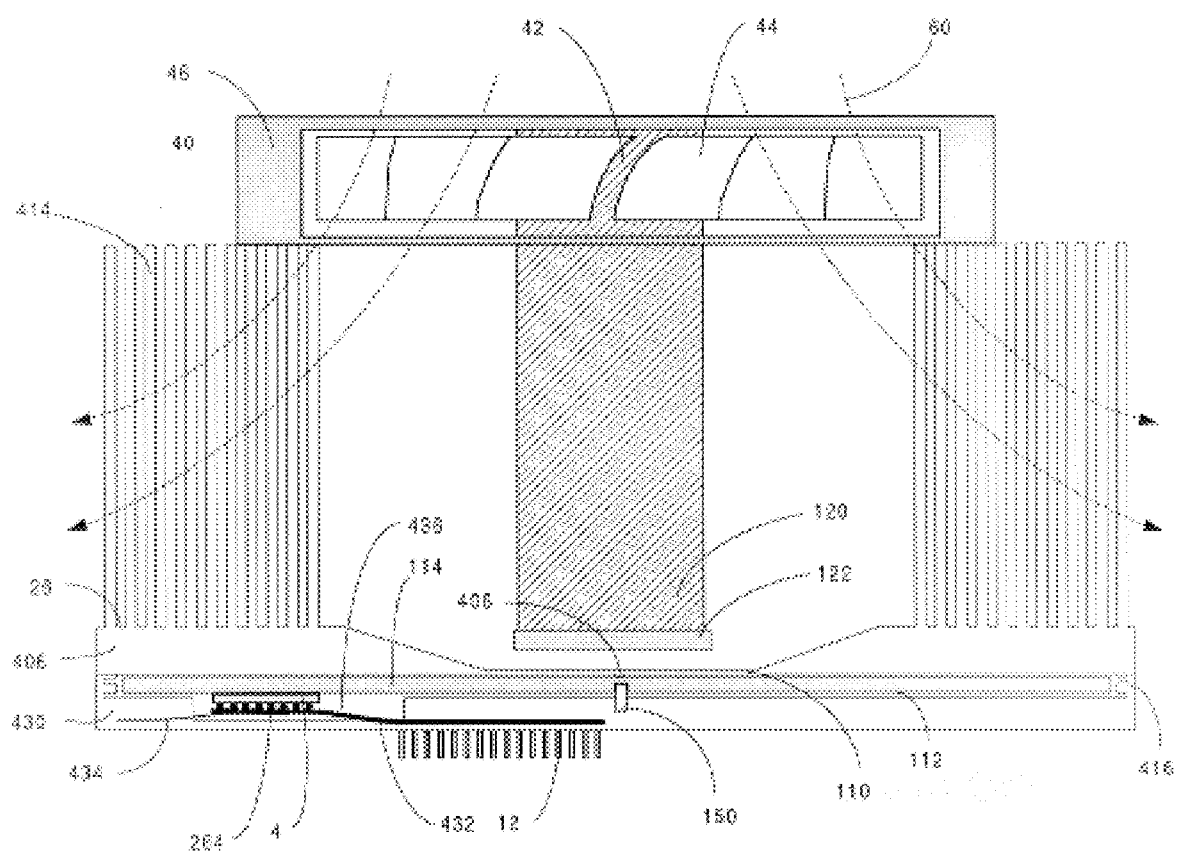
FIG. 14 shows the current invention configured with the heat source in spring suspension adjacent the thermally conducting rotor.

FIG. 14 shows an alternative to the embodiment of FIG. 13 in which the heat producing component (4) is held by a spring (434) to be in close proximity to the rotor (114). The heat source (4) is electrically connected to a flex circuit (432) by a ball grid array (264). The chip carrier (430) contains an extra cavity (436) so that the assembly of the heat source (4), the free end of the spring (434), and the free end of the flex circuit (432) can hydroplane on the thermal transport fluid as the rotor (114) rotates. In this configuration the thermal transport fluid should be compatible with chip immersion, so that the thermal transport fluid should be materials like mineral oil or Fluorinert. The lower thermal conductivities of these fluids compared to low melt allows is compensated by the very small spacing (50 to 1,000 microinches) between the heat source (4) and the rotor (114). The hydrodynamic shape of the heat source (4) is design to capture a film of thermal transport fluid between the heat source (4) and the rotor (114) in an analogous manner as the magnetic head of a Winchester drive is designed to fly on a film of air above a magnetic disk.

A presently preferred embodiment of the present invention and many of its improvements have been described with a degree of particularity. It should be understood that this description has been made by way of preferred example, and that the invention is defined by the scope of the following claims.

The invention claimed is:

1. An apparatus for transferring heat from a heat producing component to a heat absorbing component, comprising:
    a) a thermal transfer fluid;
    b) a composite substrate containing an interior cavity, the composite substrate having a surface, a first portion of the interior cavity containing the thermal transfer fluid, a first portion of the surface of the composite substrate receiving the heat producing component, a second portion of the surface of the composite substrate receiving the heat absorbing component;
    c) a thermally conductive rotor contained in a second portion of the interior cavity of the composite substrate; and
    d) an external means for rotating the thermally conductive rotor, whereby the majority of the heat produced by the heat producing component is transferred through the first portion of the surface of the composite substrate and through the thermal transfer fluid into the thermally conductive rotor, the external means rotates the thermally conductive rotor, and the heat in the thermally conductive rotor is transferred through the thermal transfer fluid and through the second portion of the surface of the composite substrate to the heat absorbing component.

2. The apparatus as in claim 1, wherein the thermal transfer fluid is a metallic alloy.

3. The apparatus as in claim 2, wherein the metallic alloy is composed of at least one of the following constituents: bismuth, cadmium, copper, gallium, indium, lead, mercury, potassium, silver, sodium, and tin.

4. The apparatus as in claim 1, wherein the interior cavity of the composite substrate is hermetically sealed.

5. The apparatus as in claim 1, wherein the thermally conductive rotor is cylindrically symmetric.

6. The apparatus as in claim 1, wherein the thermally conductive rotor is composed of at least one of the following constituents: aluminum, beryllium, chromium, copper, graphite, iron, and titanium.

7. The apparatus as in claim 1, wherein the maximum tangential velocity of the rotating thermally conductive rotor is greater than 100 centimeters per second.

8. The apparatus as in claim 1, wherein the thermally conductive rotor contains a high thermal conductivity radial insert, whereby the temperature difference between the center and the periphery of rotor is minimized.

9. The apparatus as in claim 1, wherein the external means is an external moving magnetic field, and wherein a portion of the composite substrate is permeable to the external moving magnetic field.

10. The apparatus as in claim 9, wherein the thermally conductive rotor contains a permanent magnet.

11. The apparatus as in claim 9, wherein a portion of the thermally conductive rotor is electrically conductive, whereby the external moving magnetic field generates eddy currents in the electrically conductive portion of the thermally conductive rotor.

12. The apparatus as in claim 1, wherein the external means is an axle that penetrates the surface of the composite substrate, the axle rotatably coupling the thermally conductive rotor to an external motor.

13. The apparatus as in claim 1, wherein the heat source is contained within the composite substrate.

14. The apparatus as in claim 13, wherein the heat source is flexibly mounted to the composite substrate and the heat source is immersed in the thermal transport fluid.

15. The apparatus as in claim 1, wherein the heat absorber is a fin means in thermal contact with the surface of the composite substrate.

16. The apparatus as in claim 14, further comprising a second thermal transfer fluid external to the composite substrate, wherein the second thermal transfer fluid external to the composite substrate is impelled to pass in thermal contact with the fin means.

17. The apparatus as in claim 16, further comprising:
    a) a motor; and
    b) an impeller external to the composite substrate, wherein the motor rotates the impeller external to the composite substrate, whereby the rotation of the impeller motivates the flow of the second thermal transfer fluid to pass in thermal contact with the fin means.

18. The apparatus as in claim 17, wherein the motor generates the externally generated moving magnetic field that rotates the thermally conductive rotor.

19. The apparatus as in claim 18, wherein a permanent magnet external to the composite substrate is rotated by the motor, whereby the rotating permanent magnet generates the moving magnetic field.

20. The apparatus as in claim 17, wherein the motor is rotatably coupled to the thermally conductive rotor by an axle that penetrates the surface of the composite substrate.

21. An apparatus for transferring heat from a heat producing component to the atmosphere, comprising:
    a) a thermal transfer fluid;
    b) a fin means in intimate contact with the atmosphere;
    c) a composite substrate containing an interior cavity, the composite substrate having a surface, a first portion of the interior cavity containing the thermal transfer fluid, a first portion of the surface of the composite substrate receiving the heat producing component, a second portion of the surface of the composite substrate receiving the fin means, and a portion of the composite substrate being penetrable by an external moving magnetic field;
    d) a thermally and electrically conductive rotor rotatably contained in a second portion of the interior cavity;
    e) an impeller external to the composite substrate capable of impelling the atmosphere to flow passed the fin means;
    f) a rotatable permanent magnet external to the composite substrate, whereby rotating the permanent magnet generates the external moving magnetic field, the external moving magnetic field penetrates the portion of the composite substrate, the external moving magnetic field generates an eddy current in the thermally and electrically conductive rotor, and the eddy current reacts with the moving magnetic field to rotate the thermally and electrically conductive rotor; and
    g) a motor that rotates the impeller, which impels the atmosphere to flow passed the fin means, the motor also rotating the rotatable permanent magnet, whereby heat is transferred from the heat producing component through the first portion of the surface of the composite substrate through the thermal transfer fluid to the thermally and electrically conductive rotating rotor, and heat from the thermally and electrically conductive rotating rotor is transferred through the thermal transfer fluid through the second portion of the surface of the composite substrate through the fin means into the atmosphere.

22. An apparatus for transferring heat from a heat producing component to the atmosphere, comprising:
   a) a thermal transfer fluid;
   b) a fin means in intimate contact with the atmosphere;
   c) a composite substrate containing an interior cavity, a first portion of the interior cavity containing the thermal transfer fluid, the composite substrate enclosing the heat producing component, the composite substrate receiving the fin means;
   d) a thermally conductive rotor contained in a second portion of the interior cavity of the composite substrate; and
   e) an external means for rotating the thermally conductive rotor, whereby the majority of the heat produced by the heat producing component is transferred through the thermal transfer fluid into the thermally conductive rotor, the external means rotates the thermally conductive rotor, and the heat in the thermally conductive rotor is transferred through the thermal transfer fluid through the fin means into the atmosphere.

23. A method for transferring heat from a heat producing object to a heat absorbing object, the method comprising the steps of:
   a) rotating a thermally conductive rotor in an interior cavity of a composite substrate, a portion of the interior cavity of the composite substrate also containing a thermal transfer fluid;
   b) transferring the majority of the heat from the heat producing object through a first portion of the surface of the composite substrate through the thermal transfer fluid into the thermally conductive rotor, the first portion of the surface of the composite substrate receiving the heat producing object; and
   c) transferring heat from the thermally conductive rotor through the thermal transfer fluid through a second portion of the surface of the composite substrate into the heat absorbing object, the second portion of the surface of the composite substrate receiving the heat absorbing object.

* * * * *